(12) United States Patent
Davis et al.

(10) Patent No.: US 8,847,487 B2
(45) Date of Patent: Sep. 30, 2014

(54) LUMINESCENT DEVICE

(71) Applicant: Research Triangle Institute, Research Triangle Park, NC (US)

(72) Inventors: James Lynn Davis, Holly Springs, NC (US); Anthony L. Andrady, Apex, NC (US); David S. Ensor, Chapel Hill, NC (US); Li Han, Apex, NC (US); Howard J. Walls, Apex, NC (US)

(73) Assignee: Research Triangle Insitute, Research Triangle Park, NC (US)

( * ) Notice: Subject to any disclaimer, the term of this patent is extended or adjusted under 35 U.S.C. 154(b) by 0 days.

(21) Appl. No.: 13/938,754

(22) Filed: Jul. 10, 2013

(65) Prior Publication Data

US 2013/0308334 A1 Nov. 21, 2013

Related U.S. Application Data

(60) Continuation of application No. 12/770,421, filed on Apr. 29, 2010, which is a division of application No. 11/559,260, filed on Nov. 13, 2006, now Pat. No. 7,999,455.

(51) Int. Cl.
| | |
|---|---|
| *F21V 8/00* | (2006.01) |
| *D01D 5/00* | (2006.01) |
| *D04H 1/42* | (2012.01) |
| *D01F 11/00* | (2006.01) |
| *D06M 11/52* | (2006.01) |
| *H01L 33/50* | (2010.01) |

(52) U.S. Cl.
CPC ............ *G02B 6/0008* (2013.01); *G06K 11/565* (2013.01); *D01D 5/0007* (2013.01); *H01L 33/501* (2013.01); *D04H 1/42* (2013.01); *D01F 11/00* (2013.01); *D06M 11/52* (2013.01); *G06K 11/883* (2013.01)
USPC ............................ 313/512; 313/513; 362/556

(58) Field of Classification Search
None
See application file for complete search history.

(56) References Cited

U.S. PATENT DOCUMENTS

| 3,932,780 A | 1/1976 | DeCaro et al. |
|---|---|---|
| 4,475,892 A | 10/1984 | Faunce |

(Continued)

FOREIGN PATENT DOCUMENTS

WO    WO 2009/140381 A1    11/2009

OTHER PUBLICATIONS

Regina Mueller-Mach, et al. "High-Power Phosphor-Converted Light-Emitting Diodes Based on III-Nitrides", IEEE journal on Selected Topics in Quantum Electronics, vol. 8, No. 2, Mar./Apr. 2002, pp. 339-345.

(Continued)

*Primary Examiner* — Britt D Hanley
(74) *Attorney, Agent, or Firm* — Oblon, Spivak, McClelland, Maier & Neustadt, L.L.P.

(57) ABSTRACT

A device for stimulable light emission that includes a fiber mat of nanofibers having an average fiber diameter in a range between 100 and 2000 nm, and includes plural stimulable particles disposed in association with the nanofibers. The stimulable particles produce secondary light emission upon receiving primary light at a wavelength λ. The average fiber diameter is comparable in size to the wavelength λ in order to provide scattering sites within the fiber mat for the primary light. Various methods for making suitable luminescent nanofiber mats include: electrospinning a polymer solution including or not including the stimulable particles and forming from the electrospun solution nanofibers having an average fiber diameter between 100 and 2000 nm. Methods, which electrospin without the stimulable particles, introduce the stimulable particles during electrospinning or after electrospinning to the fibers and therefore to the resultant fiber mat.

28 Claims, 15 Drawing Sheets

(56) References Cited

U.S. PATENT DOCUMENTS

| | | | |
|---|---|---|---|
| 5,892,621 | A | 4/1999 | McGregor et al. |
| 6,015,610 | A | 1/2000 | Minor et al. |
| 7,014,803 | B2 | 3/2006 | Perez et al. |
| 7,660,040 | B2 | 2/2010 | Starry et al. |
| 2001/0045547 | A1 | 11/2001 | Senecal et al. |
| 2002/0140338 | A1 | 10/2002 | Sluzky |
| 2003/0065355 | A1 | 4/2003 | Weber |
| 2003/0175199 | A1 | 9/2003 | Iyer et al. |
| 2004/0178338 | A1 | 9/2004 | Empedocles et al. |
| 2004/0186220 | A1 | 9/2004 | Smalley et al. |
| 2005/0095695 | A1 | 5/2005 | Shindler et al. |
| 2006/0194046 | A1 | 8/2006 | Ouderkirk et al. |
| 2006/0231000 | A1 | 10/2006 | Eastin et al. |
| 2007/0018116 | A1 | 1/2007 | Lustenberger et al. |
| 2007/0113530 | A1 | 5/2007 | Morozov et al. |
| 2008/0094829 | A1 | 4/2008 | Narendran et al. |
| 2008/0113214 | A1 | 5/2008 | Davis et al. |
| 2010/0014799 | A1 | 1/2010 | Bulovic et al. |
| 2010/0177518 | A1 | 7/2010 | Walls et al. |
| 2011/0194304 | A1 | 8/2011 | Han et al. |
| 2012/0033403 | A1 | 2/2012 | Lamvik et al. |
| 2012/0281428 | A1 | 11/2012 | Davis et al. |
| 2013/0215597 | A1 | 8/2013 | Davis et al. |
| 2013/0215598 | A1 | 8/2013 | Guzan et al. |
| 2013/0215599 | A1 | 8/2013 | Davis et al. |
| 2013/0241435 | A1 | 9/2013 | Lamvik et al. |

OTHER PUBLICATIONS

Michael S. Shur, et al., "Solid-State Lighting: Toward Superior Illumination", Proceedings of the IEEE, vol. 93, No. 10, Oct. 2005, pp. 1691-1703.

Xiaofeng Lu, et al., "Preparation and Characterization of $Ag_2S$ Nanoparticles Embedded in Polymer Fibre Matrices by Electrospinning", Institute of Physics Publishing, Nanotechnology 16 (2005), pp. 2233-2237.

Sabine Schlecht, et al., Toward Linear Arrays of Quantum Dots Via Polymer Nanofibers and Nonorods, American Chemical Society, Chem. Mater, Jan. 19, 2005, 17, pp. 809-814.

"Quantum Dots Lend New Approach to Solid-State Lighting", Sandia National Laboratories, www.photonics.com, press release, Jul. 24, 2003, pp. 1-4.

A.M. Srivastava et al., "Phosphors" The electrochemical Society Interface, Summer 2003, pp. 48-51.

L.S. Rohwer et al., "Development of Phosphors for LEDs," The Electrochemical Society Interface, Summer 2003, pp. 36-39.

Harish Cander, "Development of Nanophospors—A Review" Elsevier B.V., Materials Science and Engineering R 49 (2005) pp. 113-155.

A. Zukauskas, et al., "Optimization of White Polychromatic Semiconductor Lamps", American Institute of Physics, Applied Physics Letters, vol. 80, No. 2, Jan. 14, 2002, pp. 234-236.

Yuichi Yamasaki, et al., "Multi-Wavelength Intermittent Photoluminescence of Single CdSe Quantum Dots", Science and Technology of Advanced Materials 4 (2003) pp. 519-522.

Michael J. Bowers II, et al., "White-Light Emission From Magic-Sized Cadmium Selenide Nanocrystals", Journal of American Chemical Society 2005, 127 pp. 15378-15379.

J. Rodriguez-Viejo, "Cathodoluminescence and Photoluminescence of Highly Luminescent CdSe/ZnS Quantum Dot Composites", American Institute of Physics, Appl. Phys. Lett. 70 (16) Apr. 21, 1997, pp. 2132-2134.

"Sandia Researchers Use Quantum Dots As a New Approach to Solid-State Lighting", Sandia National Laboratories, pp. 1-3, press release Jul. 14, 2003, www.sandia.gov/news-cent/news-release/2003/elect-semi-sensors/quantum.html.

Chinese Office Action issued Mar. 2, 2011, in Chinese Patent Application No. 200780042143.7.

X. M. Sui, et al., "White-light emission of polyvinyl alcohol/ZnO hybrid nanofibers prepared by electrospinning", Applied Physics Letters, No. 87, 2005, pp. 113115-1 to 113115-3.

Liu, H.Q., J. B. Edel, et al. (2006). "Electrosupn polymer nanofibers as subwavelength optical waveguides incorporating quantum dots." Small 2(4): 495-499.

International Search Report issued Feb. 16, 2011 in PCT/US2010/057007 filed Nov. 17, 2010, Earliest Priority Date Dec. 30, 2009.

Written Opinion of the International Searching Authority, issued Feb. 16, 2011 in PCT/US2010/057007 filed Nov. 17, 2010, Priority Date Dec. 30, 2009.

Thomasnet News, "Silicone gel offers refractive index of 1.40", Jun. 4, 2009, pp. 1-4.

Office Action issued Mar. 7, 2012 in Chinese Patent Application No. 200780042143.7 (English translation only).

Office Action issued Oct. 26, 2012, in Chinese Patent Application No. 200780042143.7 (submitting English translation only).

Extended European Search Report issued Nov. 29, 2012, in European Patent Application No. 07844897.4.

Youliang Hong, et al., "In Situ Growth of ZnO Nanocrystals from Solid Electrospun Nonofiber Matrixes", Langmuir, vol. 22, No. 17, XP-55044739, Jul. 1, 2006, pp. 7331-7334.

EryunYan, et al., "Polyvinylpyrrolidone/tris(8-quinolinolato) aluminum hybrid Polymer fibers by electrospinning", Materials Letters, vol. 60, No. 24, XP-027898036, Oct. 1, 2006, pp. 2969-2973.

Xinghua Yang, et al., "Preparation and characterization of ZnO nanofibers by using electrospun PVA/zinc acetate composite fiber as precursor", Inorganic Chemistry Communications, vol. 7, No. 2, XP-55044728, Feb. 1, 2004, pp. 176-178.

Xinghua Yang, et al., "Nanofibers of CeO2 via an electrospinning technique", Thin Solid Films, vol. 478, No. 1-2, XP-027865160, May 1, 2005, pp. 228-231.

P. W. Gibson, et al., "Electrospun Fiber Mats: Transport Properties", AIChE Journal, vol. 45, No. 1, XP-55044788, Jan. 1, 1999, pp. 190-195.

Young Jun Ryu, et al., "Transport Properties of electrospun nylon 6 nonwoven mats" European Polymer Journal, vol. 39, No. 9, XP-004442900, Sep. 1, 2003, pp. 1883-1889.

Babel, et al., "Electrospun Nanofibers of Blends of Conjugated Polymers: Morphology, Optical Properties, and Field-Effect Transistors," Macromolecules 2005, 38 p. 4705-4711, Apr. 27, 2005.

Sui, et al., "White emission of polyvinyl alcohol/ZnO hybrid nanofibers prepared by electrospinning," Applied Physics Letters 87, 113115 (2005), published online Sep. 9, 2005.

U.S. Appl. No. 14/123,248, filed Dec. 2, 2013, Davis, et al.

U.S. Appl. No. 14/103,110, filed Dec. 11, 2013, Davis, et al.

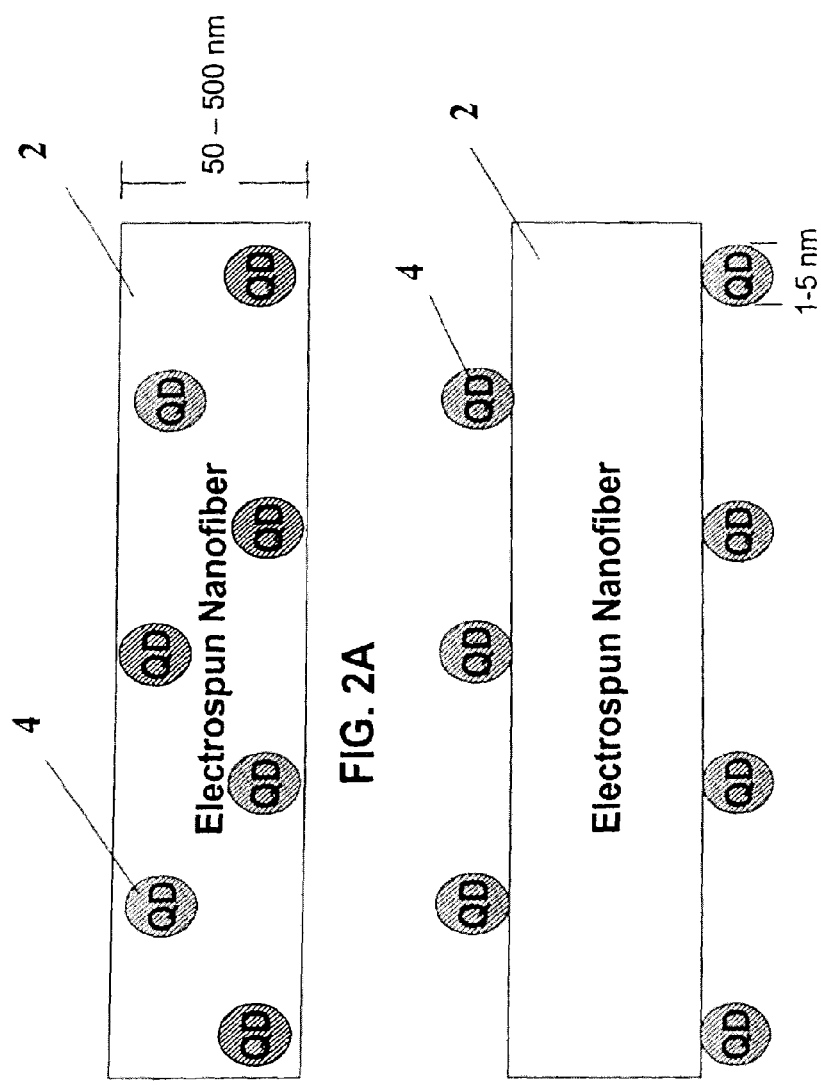

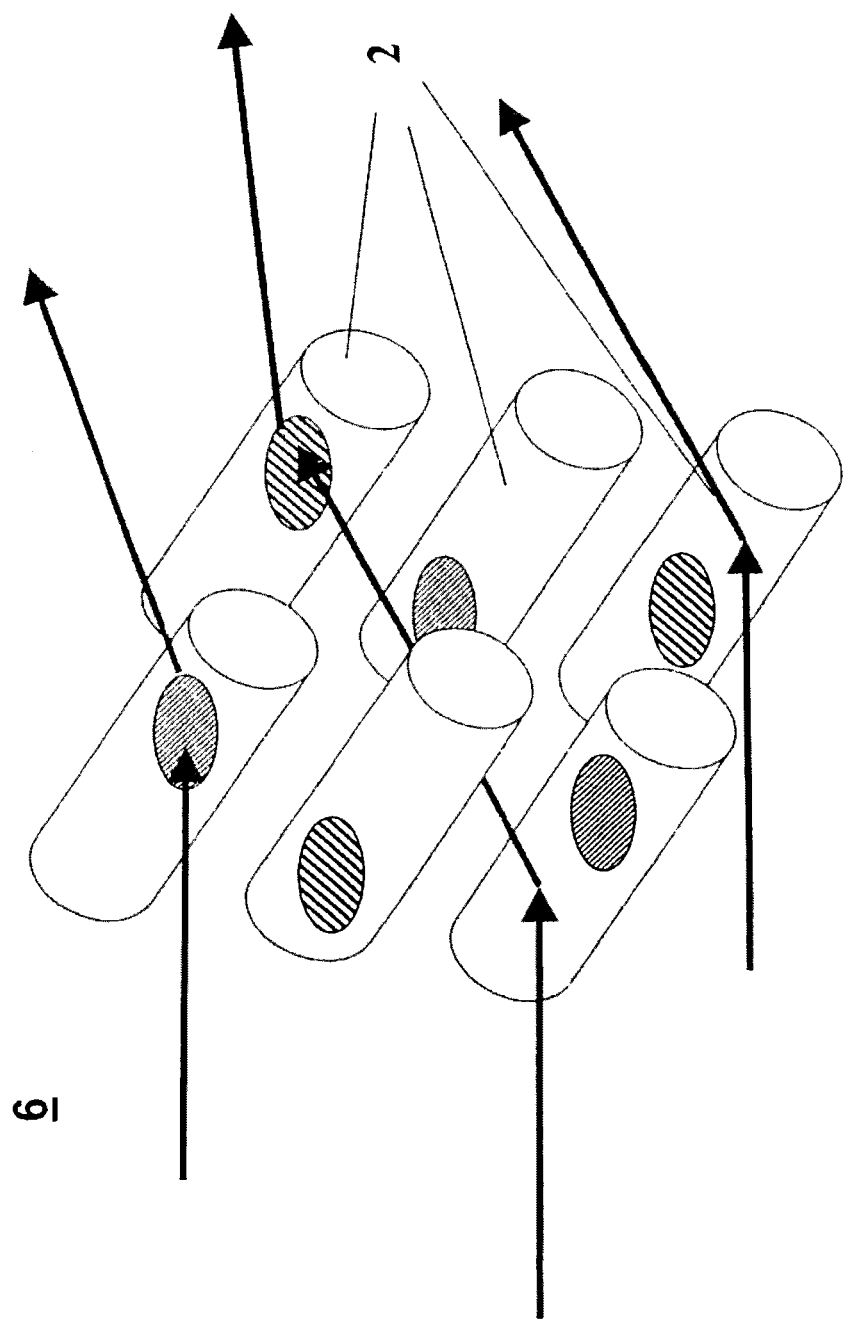

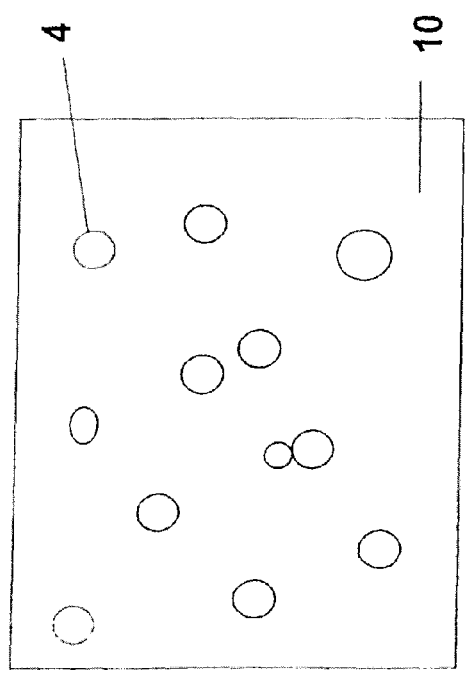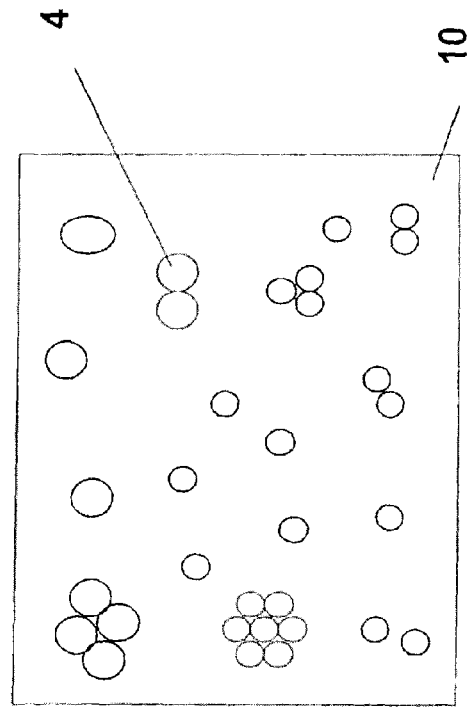

Red & Green CdSe Nanoparticles in PMMA

LUMINESCENT DEVICE

CROSS REFERENCE TO RELATED APPLICATIONS

This application is a continuation of U.S. Ser. No. 12/770, 421, filed Apr. 29, 2010, the entire contents of which are incorporated herein by reference. U.S. Ser. No. 12/770,421 is a Divisional of application Ser. No. 11/559,260, filed Nov. 13, 2006, the entire contents of which are incorporated herein by reference and which is related to U.S. Ser. No. 10/819,916, filed on Apr. 8, 2004, entitled "Electrospinning of Polymer Nanofibers Using a Rotating Spray Head," the entire contents of which are incorporated herein by reference. This application is also related to U.S. Ser. No. 10/819,942, filed on Apr. 8, 2004, entitled "Electrospray/electrospinning Apparatus and Method," the entire contents of which are incorporated herein by reference. This application is related to U.S. Ser. No. 10/819,945, filed Apr. 8, 2004, entitled "Electrospinning in a Controlled Gaseous Environment," the entire contents of which are incorporated herein by reference. This application is related to U.S. Ser. No. 11/130,269, filed May 17, 2005 entitled "Nanofiber Mats and Production Methods Thereof," the entire contents of which are incorporated herein by reference. This application is related to U.S. Ser. No. 11/559,282, filed on Filed, Nov. 13, 2006 entitled "Particle Filter System Incorporating Nanofibers," the entire contents of which are incorporated herein by reference.

BACKGROUND OF THE INVENTION

1. Field of the Invention

Nanofiber mats and methods for producing nanofiber mats having light emitting properties, and the application of the nanofiber mats in lighting applications.

2. Description of the Related Art

The choice of general illumination sources for commercial and residential lighting is generally governed by a balance of energy efficiency and the ability to faithfully produce colors as measured by the color rendering index (CRI). Existing fluorescent lighting is known to be economical from an energy consumption point of view. However, many users complain that the light produced by the existing fluorescent lighting is of poor spectral quality and produces eye strain and other adverse health effects. Incandescent light is also widely used and is recognized as having excellent spectral quality and the ability to accurately render colors. This high spectral quality is derived from the hot filament, which serves as a blackbody radiator and emits light over many wavelengths, similar to the sun. However, incandescent lighting suffers from very low energy efficiency. Thus, there is a long felt need to produce light sources that use less energy and have a light composition similar to the composition of the sun light.

Solid-state lighting (SSL) is an alternative general illumination and lighting technology that promises the energy efficiency of fluorescent lights and the excellent spectral qualities of incandescent lighting. Typically, commercially available SSL technologies consists of a light emitting diode (LED) surrounded by a phosphor composed of large particles usually larger than 2 µM. The light emitted from the LED is of sufficient energy to cause the phosphor to fluoresce and emit one or more colors of visible light. The most common example of commercial SSL products consists of a blue LED (typically 460 nm) surrounded by a yellow phosphor, such as cerium-doped yttrium aluminum garnet (YAG:Ce), that emits lights in a broad band centered at 550 nm. The combination of the yellow light emission from the phosphor and blue light from the LED produces a light source that has a generally white appearance. Alternatively, an LED that emits in the ultraviolet (<400 nm) can be used to excite a blend of red, green, and blue phosphors. FIG. 1 is a schematic depiction of the spectrum of light obtained from a solid-state lighting device. While this approach produces white light, it suffers from low efficiency and poor spectral quality due to the limited number of wavelengths.

In addition, while the light intensity from current solid-state lights is sufficient for applications such as flashlights, it is considered too low and the emission cone is considered too narrow for use in general illumination applications such as room lighting. Hence, there is a need for solid-state light sources that are capable of providing high intensity white light emissions over a large enough area for use in general illumination.

One approach proposed to improve the performance of SSL devices has been to use nanoparticles such as quantum dots as secondary converters to produce white light. "Quantum Dots Lend New Approach to Solid-State Lighting," Sandia National Laboratory press release Jul. 24, 2003. This approach incorporates quantum dots into a polymer used to encapsulate the light emitting diode (LED) and essentially creates a three-dimensional dome of quantum dots around the LED die. While this method has been successful in producing white light, the three-dimensional dome structure places large quantities of quantum dots in non-optimal positions around the LED and creates potential quantum dot agglomeration issues.

Previously, polymer/quantum dot compound nanofibers have been obtained from electrospinning of the polymer/quantum dot composite solutions, as disclosed in Schlecht et. al., Chem. Mater. 2005, 17, 809-814. However, the nanofibers produced by Schlecht et al. were on the order of 10-20 nm in diameter, in order to produce quantum confinement effects. The size range of the nanoparticles and nanofibers disclosed therein is not advantageous for conversion of a primary light into secondary light emission across the white light spectrum.

Lu. et. al., Nanotechnology, 2005, 16, 2233, also reported the making of $Ag_2S$ nanoparticles embedded in polymer fiber matrices by electrospinning. Once again, the size range of the nanoparticles and nanofibers shown therein is not advantageous for conversion of a primary light into secondary light emission across the white light spectrum.

SUMMARY OF THE INVENTION

In one embodiment of the present invention, there is provided a device for stimulable light emission. The device includes a fiber mat of nanofibers having an average fiber diameter in a range between 100 and 2000 nm, and includes plural luminescent particles disposed in association with the nanofibers and configured to produce secondary light emission upon receiving primary light at a wavelength λ. The average fiber diameter is comparable in size to the wavelength λ in order to provide scattering sites within the fiber mat for the primary light.

In one embodiment of the present invention, there is provided a method for making luminescent fiber mats. The method electrospins a polymer solution including luminescent particles and forms from the electrospun solution nanofibers having an average fiber diameter between 100 and 2000 nm and including the luminescent particles. The method collects the nanofibers to form a fiber mat.

In one embodiment of the present invention, there is provided a method for making luminescent fiber mats. The method electrospins a polymer solution to form nanofibers having an average fiber diameter between 100 and 2000 nm. The method coats the nanofibers during the electrospinning with luminescent particles and collects the nanofibers to form a fiber mat.

In one embodiment of the present invention, there is provided a method for making luminescent fiber mats. The method electrospins a polymer solution to form nanofibers having an average fiber diameter between 100 and 2000 nm. The method collects the nanofibers to form a fiber mat and coats the fiber mat with luminescent particles.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2A is schematic depicting the disposition of luminescent compounds inside a volume of a fiber, according to one embodiment of the present invention;

FIG. 2B is schematic depicting the disposition of luminescent compounds on or near the surface of a fiber, according to one embodiment of the present invention;

FIG. 2D is schematic depicting a fiber mat, according to one embodiment of the present invention, in which the fibers serve as individual scattering centers;

FIG. 6A is a schematic of a quantum dot dispersion in a polymer matrix at a concentration where agglomeration is present only at a low concentration;

FIG. 6B is a schematic of a quantum dot dispersion in a polymer matrix at a concentration where agglomeration is a factor;

DETAILED DESCRIPTION OF THE EMBODIMENTS

Figure 1:
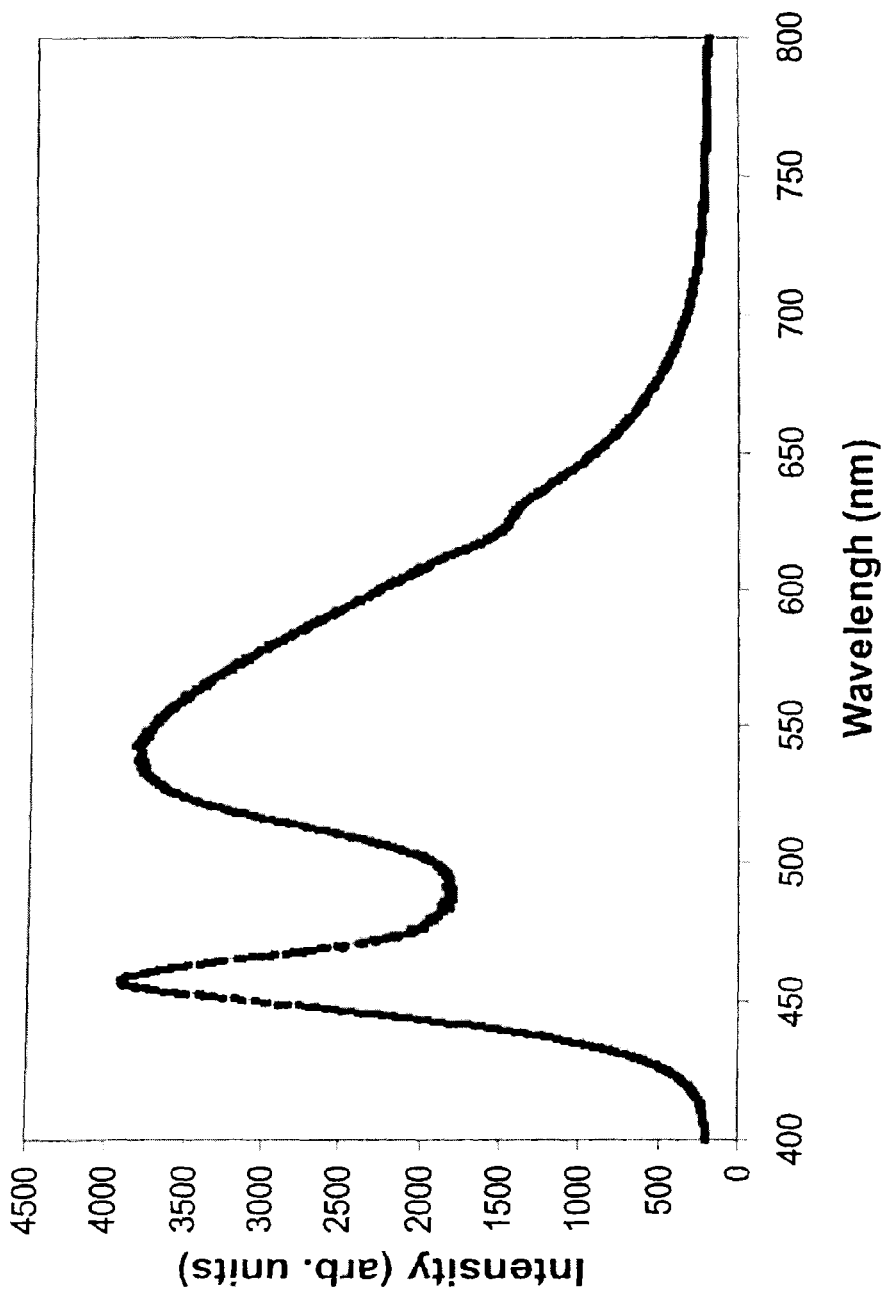
FIG. 1 is a schematic depiction of the spectrum of light obtained from a conventional solid-state lighting device.

Quantum dots are nanoparticles whose dimensions have an order of magnitude equivalent to or smaller than the size of an electron at room temperature (deBroglie wavelength). When the size of the quantum dot is roughly the same or smaller than the deBroglie wavelength of an electron, then a potential well is created that artificially confines the electron. The size of this potential well determines the quantized energy levels available to the electron, as described in the "particle-in-a-box" solution of basic quantum mechanics. Since the energy levels determine the fluorescent wavelengths of the quantum dot, merely changing the size of the quantum dot changes, to a first approximation, the color at which the quantum dot radiates visible light. Thus, the quantum confinement effects of the quantum dots directly influence the light emitted from the respective quantum dot, and a broad spectrum of colors may be achieved by assembling quantum dots of different sizes.

A typical quantum dot includes a nanocrystalline core that may be surrounded by a shell of an inorganic material with a higher band gap. This structure is capped with an external organic layer that ensures compatibility with various solvents. In this context, the entire assembly (i.e., nanocrystalline core, shell of higher band gap material, and organic capping layer) is referred to collectively as a quantum dot. A representative example of such quantum dots consists of a cadmium selenide nanocrystalline core surrounded by a zinc sulfide shell and capped with organic ligands such as trioctylphosphine oxide. Such core shell structures are sold by Evident Technologies of Troy, N.Y.

The nanocrystalline core of quantum dots may be fabricated from a variety of materials including but not limited to at least one of silicon, germanium, indium phosphide, indium gallium phosphide, indium phosphide, cadmium sulfide, cadmium selenide, lead sulfide, copper oxide, copper selenide, gallium phosphide, mercury sulfide, mercury selenide, zirconium oxide, zinc oxide, zinc sulfide, zinc selenide, zinc silicate, titanium sulfide, titanium oxide, and tin oxide, etc. Of particular utility to the present invention are quantum dots having a core of at least one of CdSe, InGaP, InP, GaP, and ZnSe. The optical properties of quantum dots are produced by this nanocrystalline core.

Quantum dots are commercially available as colloidal dispersions in low dielectric constant (low-K) organic solvents such as toluene. However, quantum dots experience mutual attraction and can agglomerate, which may disrupt their quantum behavior and change their performance characteristics. For example, agglomeration is known to reduce the light emission efficiency of quantum dots and is known to cause red-shifts in emission frequency due to energy transfer to larger dots formed as a result of agglomeration. See J. Rodriguez-Viejo, K. F. Jensen, H. Mattoussi, J. Michel, B. O. Dabbousi and M. G. Bawendi, *Applied Physics Letters*, vol. 70 (1997), no. 16, page 21, the entire contents of which are incorporated herein by reference. Due to the sensitivity of the human eye to slight color variations, particle agglomeration can have a significant impact on the quality of light from an illumination source. In the extreme, agglomeration can lead to quenching of photoluminescence from quantum dots.

Nanofibers are a solid structure that has one dimension (diameter) in the 10-2000 nm range, and the other dimension (length) can be quite long in the meters range. Nanofibers suitable for the present invention can be made from a variety of materials, including polymers, ceramics, and glasses, sol gels, polyimides, and blends of materials can also be readily fabricated. One feature of nanofibers is their small diameter and consequently high surface area. Nanofiber diameters on the order of visible light (~500 nm) or even smaller can be readily produced creating very large surface areas.

Figure 2C:
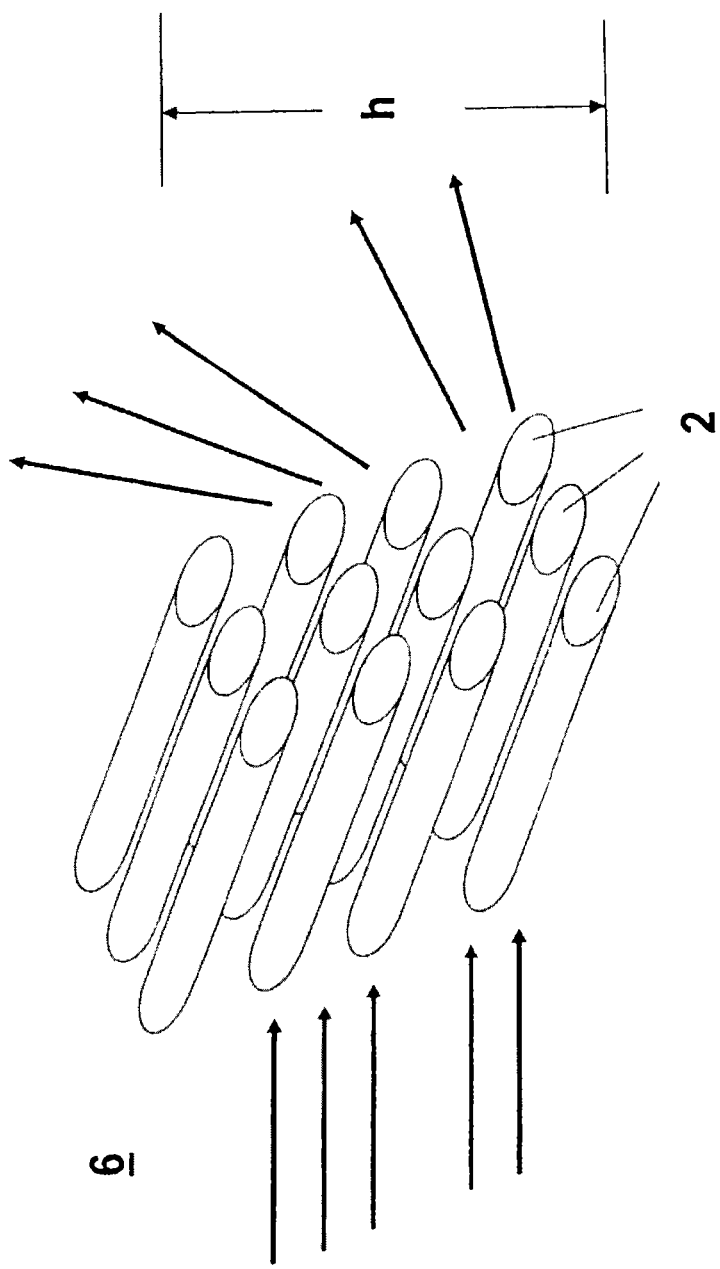
FIG. 2C is schematic depicting a fiber mat, according to one embodiment of the present invention, in which the fiber mat in total serves as an optical scattering center.

Referring now to the drawings, wherein like reference numerals designate identical or corresponding parts throughout the several views, in various embodiments of the present invention, FIGS. 2A and 2B are schematics depicting a light stimulable fibers (LF) 2 including for example a luminescent particle 4 (i.e., one of the compounds disclosed below) disposed either on the surface or in the bulk of the nanofiber. More specifically, FIG. 2A is schematic depicting the disposition of luminescent particles 4 (e.g., light stimulable particles such as quantum dot semiconductor materials or nano-phosphors) inside a volume of a fiber 2, which in FIG. 2A is depicted as a nanofiber. FIG. 2B is schematic depicting the disposition of luminescent particles 4 on or near the surface of a fiber 2, which in FIG. 2B is also depicted as a nanofiber. FIG. 2C is schematic depicting a fiber mat 6, according to one embodiment of the present invention, in which the fiber mat 6 in total serves as an optical scattering center. In this configuration, according to one embodiment of the present invention, stimulable particles (while not explicitly shown) are disposed in association with the nanofibers 2 throughout the fiber mat thickness h. The nanofibers 2 cumulatively provide scattering sites for excitation (or primary) light, thereby in one embodiment of the present invention enhancing the probability of interaction between the pump source light and the stimulable particles 4.

FIG. 2D is schematic depicting a fiber mat 6, according to one embodiment of the present invention, in which the fibers 2 are shown as individual scattering centers. The nanofibers 2 individually provide scattering sites for excitation (or primary) light, thereby in one embodiment of the present invention enhancing the probability of interaction between the pump source light and the stimulable particles 4.

Hence, in various embodiments of the present invention to be explained in greater detail below, there is provided a device including the fiber mats shown for example in FIGS. 2C and 2D for stimulable emission from a fiber mat. The fiber mat 6 includes nanofibers having an average fiber diameter in a range between 100 and 2000 nm, and plural light stimulable particles disposed in association with the nanofibers. The stimulable particles 4 can produce secondary light emission upon receiving primary light at a wavelength $\lambda$. The average fiber diameter is comparable in size to the wavelength $\lambda$ in order to provide scattering sites within the fiber mat for the primary light.

As discussed later in greater detail, the average fiber diameter is in a range between 100 to 2000 nm, or more suitably between 300 nm to 600 nm, or more suitably between 400 nm to 500 nm. The average fiber diameter is in a range of 0.50 to 1.50 of the wavelength $\lambda$, or more suitably in a range of 0.9 to 1.10 of the wavelength $\lambda$. The wavelength $\lambda$ is in a range between 100 and 2000 nanometers, or more suitably between 400 and 500 nanometers. The fiber mat 6 has a thickness in a range between 0.1 and 2,000 microns, or more suitably in a range between 1 to 500 microns.

In various embodiments of the present invention, the stimulable particles 4 include for example besides or in addition to the quantum dot materials listed above nano-phosphors. Nano-phosphors such as for example in the list below and others are suitable for the present invention. Examples of suitable nanophosphors include, but are not limited to:

1. Rare-Earth doped metal oxide such as $Y_2O_3$:Tb, $Y_2O_3$:$Eu^{3+}$, $Lu_2O_3$:$Eu^{3+}$, $CaTiO_3$:$Pr^{3+}$, $CaO$:$Er^{3+}$, $(GdZn)O$:$Eu^{3+}$;
2. Rare-Earth doped yttrium aluminum garnet (YAG) such as YAG:$Ce^{3+}$;
3. Rare-Earth doped zirconium oxide such as $ZrO_2$:$Sm^{3+}$, $ZrO_2$:$Er^{3+}$;
4. Rare-Earth doped vanadate ($YVO_4$:Eu) and phosphate (La, Ce,Tb)$PO_4$;
5. Doped materials consisting of a host matrix (e.g., $Gd_2O_3$, $GdO_2S$, PbO, ZnO, ZnS, ZnSe) and a dopant (Eu, Tb, Tm and Mn); and
6. Metal-doped forms of zinc sulfide and zinc selenide (e.g., ZnS:$Mn^{2+}$, ZnS:$Cu^+$).

Of particular utility to the present invention are nanonphosphors including at least one of rare-Earth doped YAG, doped ZnS, and doped ZnSe.

Figure 2E:
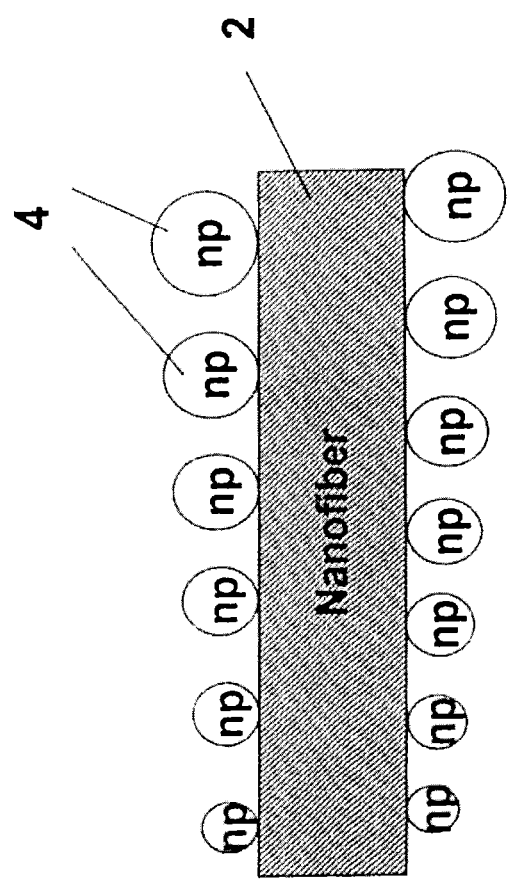
FIG. 2E is schematic depicting a fiber mat, according to one embodiment of the present invention, in which the fibers have a distribution of different size quantum dots on the fibers.

Further, as discussed in more detail later, the stimulable particles 4 can include a plurality of color-distinctive light emitters (i.e., a distribution of different sized quantum dots or a distribution of nano-phosphors) which produce respective secondary light emissions from the primary light and thereby form a resultant white light having a color rendering index greater than 70, or greater than 80. FIG. 2E is schematic depicting a fiber mat 6, according to one embodiment of the present invention, in which the fibers have a distribution of different size quantum dots on the fibers.

In one embodiment of the present invention, by dispersing the stimulable particles 4 on a high surface area medium such as for example a fiber mat of nanofibers, the emission efficiency of a fiber mat 6 containing the nanofibers 2 and the stimulable particles 4 (e.g., the quantum dots) is increased above that achieved with planar packing of the luminescent particles are dispersed in a film. As a result, in one embodiment of the present invention, such a nanofiber mat structure can capture, with a higher efficiency than if the quantum dots were dispersed in a film, photons emitted by an LED and re-radiate at visible wavelengths with higher intensities than would be possible with planar packed luminescent particles.

While not limited to any particular theory, light scattered from the fibers 2 depends on the fiber diameter, light wavelength, orientation of the fiber to the light and the refractive index of the fibers. Polymers of the fibers have real refractive indices in the range between 1.3 to 1.6. Examples of the light scattering efficiency curves for long fibers of slightly absorbing materials (and which may act in a similar manner as the nanofiber structures of the present invention) have been detailed previously by Van de Hulst, in Light Scattering by Small particles, Dover, 1957. In that earlier work, for an incident light of 300 nm, the maximum light scattering has a size parameter ($\pi$ times fiber diameter/wavelength) of 3.14 and a scattering efficiency (Q) of $Q_1$=4.2. For incident light at 600 nm, the size parameter is 1.6 and $Q_1$=2. Therefore, the shorter wavelength light (expected to be used frequently in the present invention) is twice as likely of being trapped in the mat of fibers than the longer wavelength light. An alternative explanation of this phenomenon is that, on average, the optical path length (OPL) of light at 400 nm through an appropriately designed nanofiber material is longer than the OPL of 600 nm light. The implications of this phenomena as applied to the present invention are that an enhancement of light emission may be obtained from the light scattering characteristics of the fibers in the fiber mat (i.e., each fiber acting as a scattering center, and the mat of fibers acting as a medium to more effectively confine the excitation light in the fiber mat medium permitting a higher probability that the excitation light would interact with a light emitter during its residence in the fiber mat.

For example, in the present invention a typical excitation frequency is blue light at 450 nm. In order to produce white light, the structure will need to emit radiation over a broad range of frequencies from 450 nm to 800 nm. By fabricating a nanofiber structure in which the average diameter of the nanofibers 4 in the mat 6 is roughly the same as that of the excitation source (i.e., 450 nm), the excitation frequency can be effectively trapped in the nanofiber structure by light scattering (i.e., OPL of the excitation source is long). This increases the likelihood that the excitation source will initiate fluorescence and produce white light. In contrast, the longer wavelength emissions produced by fluorescence of the luminescent compound will be scattered less effectively by the nanofibers in the fiber mat, and are more likely to emerge from the fiber mat structure with minimal scattering. Under these conditions, the light scattering/photonic properties as a function of wavelength and fiber diameter are improved.

In one embodiment of the present invention, the fiber mat 6 includes a number of nanofibers layers (as shown in FIG. 2C). The nanofibers 2 of these layers serve individually as scattering centers for the incident excitation light. Typically, the nanofibers have an average diameter that is approximately that of the wavelength of the excitation source (i.e., from 200-500 nm). Furthermore, the number of layers in the fiber may typically form a thickness for the fiber mat 6 in a range of 0.1 to 2,000 microns, although thinner values such as for example 0.01 microns and thicker values such as for example 3,000 microns are suitable. The thinner layers may not be as likely to "capture" the incident excitation light, and the thicker layers may substantially scatter the induced light from the quantum dots.

To verify the effect of appropriately sized fibers in a light stimulable structure of the present invention (i.e., fibers sized to a diameter that is close to the excitation frequency wavelength), a fiber mat having nanofibers with an average diameter of 450 nm and a polymer film containing no nanofibers were prepared. Both materials had equal amounts of quantum dots (i.e., luminescent compounds).

Figure 3:
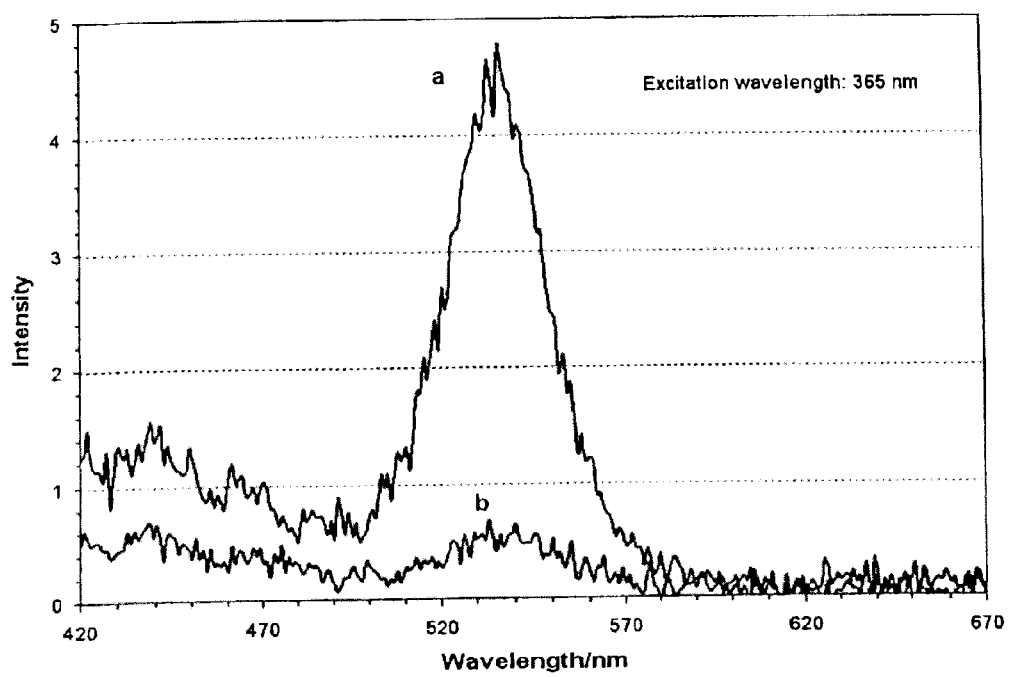
FIG. 3 is the resultant light spectrum from two samples, a fiber mat in curve "a" and a polymer film in curve "b" containing no nanofibers, each having equal concentrations of quantum dots.

FIG. 3 is the resultant light spectrum from these two samples. When the quantum dots are dispersed in the nanofibers, the intensity of fluorescent emission increased by roughly an order-of-magnitude as compared to the polymer film sample, as indicated by the intensity of light emissions of the 540 nm peak in the corresponding spectrum shown by curve "a" in contrast to curve "b" of the polymer film sample. This improvement in performance is believed to be due to the difference in structure between a nanofiber matrix and the solid film, as explained above. That is, the nanofiber mat of the present invention permits higher energy light (e.g., UV excitation) to be more efficiently captured by the quantum dots to produce higher intensity light emission from the quantum dot containing medium. It is likely that agglomeration did not reduce intensity in the solid film because there is little red shift seen in the spectra for the solid film (i.e., curve "b"). Moreover, using transmission electron microscopy (TEM) and UltraViolet-Visible Spectroscopy, the quantum dots were found to be uniformly dispersed throughout the fiber mat, regardless of size.

Fabrication Procedures

Formation of the light stimulable structures in the present invention can occur through a number of methods. The formation methods typically involve the formation of nanofibers 2 of a controlled diameter and the application of the stimulable particles 4 (e.g., quantum dots) to the nanofibers 2. In one method, stimulable particles 4 can be applied to the electrospun fibers as the fibers are coalescing into a resultant fiber mat. In one method, stimulable particles 4 can be included in the electrospray medium. In one method, stimulable particles 4 can be applied to the resultant fiber mat after the mat has been formed without any stimulable particles.

Figure 4:
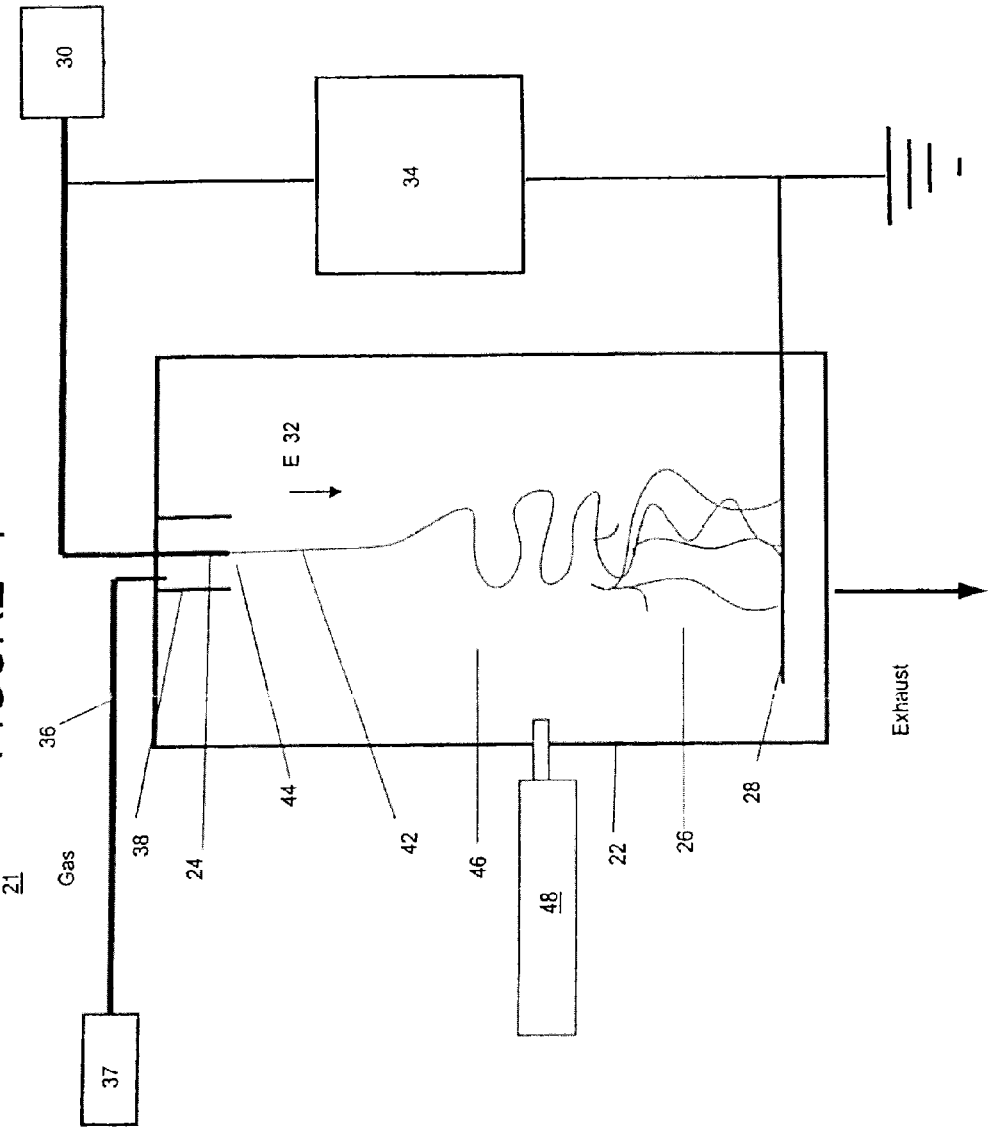
FIG. 4 is a schematic illustration depicting an electrospinning apparatus suitable for deposition of fibers and/or nanofibers of the present invention including nanoparticle light emitters.

FIG. 4 is a schematic illustration depicting an electrospinning apparatus suitable for deposition of fibers and/or nanofibers of the present invention, including the deposition of fibers and/or nanofibers having stimulable particles 4 including nanoparticle light emitters such as the above-noted quantum dots and nano-phosphors. In one embodiment of the present invention, the stimulable particles 4 incorporated into the fibers and/or nanofibers of the present invention are smaller than the diameter of the nanofibers.

In FIG. 4, an electrospinning apparatus 21 includes a chamber 22 surrounding an electrospinning element 24. As such, the electrospinning element 24 is configured to electrospin a substance from which fibers are composed to form fibers 26. The electrospinning apparatus 21 includes a collector 28 disposed from the electrospinning element 24 and configured to collect the fibers and/or nanofibers. Various methods for forming fibers and nanofibers are described in U.S. Ser. Nos. 10/819,942, 10/819,945, and 10/819,916 listed and incorporated by reference above.

The electrospinning element 24 communicates with a reservoir supply 30 containing the electrospray medium such as for example the above-noted polymer solution. The electrospray medium of the present invention includes polymer solutions and/or melts known in the art for the extrusion of fibers including extrusions of nanofiber materials. Indeed, polymers and solvents suitable for the present invention include for example polystyrene in dimethylformamide or toluene, polycaprolactone in dimethylformamide/methylene chloride mixture, poly(ethyleneoxide) in distilled water, poly(acrylic acid) in distilled water, poly(methyl methacrylate) PMMA in acetone, cellulose acetate in acetone, polyacrylonitrile in dimethylformamide, polylactide in dichloromethane or dimethylformamide, and poly(vinylalcohol) in distilled water and combinations thereof. In general, suitable solvents for the present invention include both organic and inorganic solvents in which polymers can be dissolved. The polymer materials when formed are preferably transparent materials, although the polymers may be spun with additives that act as color filters for the luminescent compounds (as discussed in more detail later).

A high voltage source 34 is provided to maintain the electrospinning element 24 at a high voltage. The collector 28 is placed preferably 1 to 100 cm away from the tip of the electrospinning element 24. The collector 28 can be a plate or a screen. Typically, an electric field strength between 2,000 and 400,000 V/m is established by the high voltage source 34. Typically, the collector 28 is grounded, and the fibers 26 produced by electrospinning from the electrospinning elements 24 are directed by the electric field 32 toward the collector 28. The electric field 32 pulls the substance from which the fiber is to be composed as a filament or liquid jet 42 of fluid from the tip of the electrospinning element 24. A supply of the substance to each electrospinning element 24 is preferably balanced with the electric field strength responsible for extracting the substance from which the fibers are to be composed so that a droplet shape exiting the electrospinning element 24 is maintained constant. In the polymer solutions (or alternatively introduced onto the fibers after or during the electrospinning process) are luminescent compounds. The fibers deposited in the one embodiment of the present invention may range from 50 nm to several microns in diameter.

As in the related application, U.S. Ser. No. 11/130,269, previously incorporated by reference, the present invention can use different electrospinning elements to generate a fiber mat of mixed fibers of different sized fibers. The fiber mat can have for example one side of the mat with a larger average fiber diameter than another side of the fiber mat.

The fibers used in the nanofibers of the present invention include, but are not limited to, acrylonitrile/butadiene copolymer, cellulose, cellulose acetate, chitosan, collagen, DNA, fibrinogen, fibronectin, nylon, poly(acrylic acid), poly(chloro styrene), poly(dimethyl siloxane), poly(ether imide), poly(ether sulfone), poly(alkyl acrylate), poly(ethyl acrylate), poly(ethyl vinyl acetate), poly(ethyl-co-vinyl acetate), poly(ethylene oxide), poly(ethylene terephthalate), poly(lactic acid-co-glycolic acid), poly(methacrylic acid) salt, poly(methyl methacrylate), poly(methyl styrene), poly(styrene sulfonic acid) salt, poly(styrene sulfonyl fluoride), poly(styrene-co-acrylonitrile), poly(styrene-co-butadiene), poly(styrene-co-divinyl benzene), poly(vinyl acetate), polylactides, poly(vinyl alcohol), poly(vinyl chloride), poly(vinylidene fluoride), polyacrylamide, polyacrylonitrile, polyamide, polyaniline, polybenzimidazole, polycaprolactone, polycarbonate, poly(dimethylsiloxane-co-polyethyleneoxide), poly(etheretherketone), polyethylene, polyethyleneimine, polyimide, polyamide, polyisoprene, polylactide, polypropylene, polystyrene, polysulfone, polyurethane, poly(vinylpyrrolidone), proteins, SEBS copolymer, silk, and styrene/isoprene copolymer.

Additionally, nanofibers containing polymer blends can also be produced as long as the two or more polymers are soluble in a common solvent. A few examples would be: poly(vinylidene fluoride)-blend-poly(methyl methacrylate), polystyrene-blend-poly(vinylmethylether), poly(methyl methacrylate)-blend-poly(ethyleneoxide), poly(hydroxypropyl methacrylate)-blend poly(vinylpyrrolidone), poly(hydroxybutyrate)-blend-poly(ethylene oxide), protein blend-polyethyleneoxide, polylactide-blend-polyvinylpyrrolidone, polystyrene-blend-polyester, polyester-blend-poly(hyroxyethyl methacrylate), poly(ethylene oxide)-blend poly(methyl methacrylate), poly(hydroxystyrene)-blend-poly(ethylene oxide)).

Light Emitter Embedment

Figure 5:
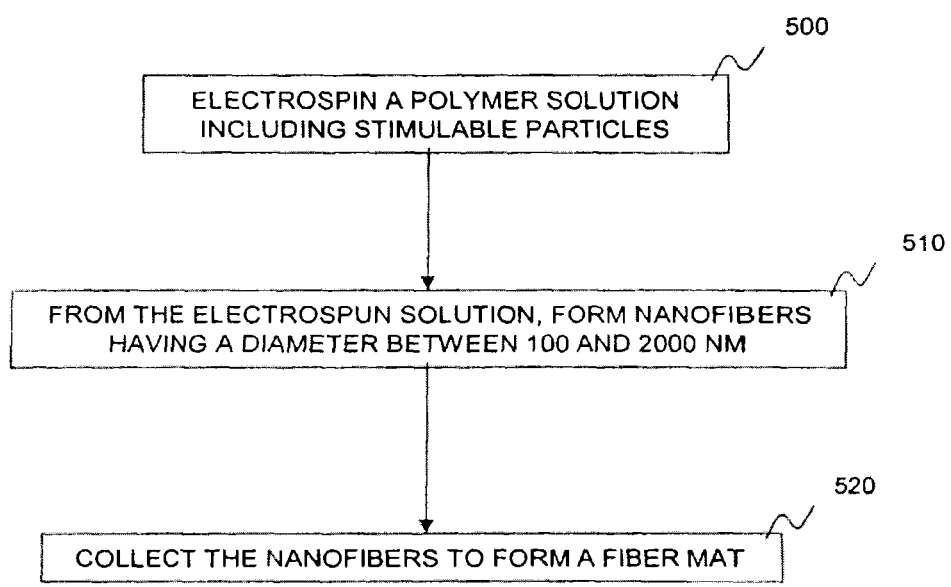
FIG. 5 is a flow chart illustrating a method for forming a luminescent device according to an embodiment of the present invention in which luminescent particles are included in an electrospray polymer.

In general, FIG. 5 is a flow chart illustrating the first above-noted method for forming a luminescent device according to an embodiment of the present invention in which stimulable particles 4 are included in an electrospun polymer. At 500, a polymer solution including stimulable particles (e.g., light stimulable particles) is electrospun using conditions described above. At 510, from the electrospun solution, nanofibers are formed having a diameter between 100 and 2000 nm and including the stimulable particles. At 520, the nanofibers are collected to form a fiber mat.

The process at 500 reflects the general techniques described above for electrospraying nanofibers preferably under controlled conditions. At 500, care is taken to sonicate the stimulable compounds in solvent prior to mixing with the polymer in the reservoir 30 to ensure adequate dispersion. Adequate dispersion results in a uniform distribution of the stimulable particles throughout the resultant fiber mat. Normally, a sonication time greater than 24 hours is sufficient to obtain a uniform luminescent compound suspension in the solution. The ratio of polymer to luminescent compound in the solution will typically range from 2:1 to 100:1

Further, according to one embodiment of the present invention, a local concentration of the stimulable particles in the polymer solution that is too high can result in deleterious agglomeration of these compounds. FIG. 6A is a schematic of a stimulable particle 4 (i.e., quantum dot, luminescent or light stimulable compound) dispersion in a polymer matrix 10 at a concentration where agglomeration is at a low concentration, and typically is not a factor. FIG. 6B is a schematic of a quantum dot 4 dispersion in a polymer matrix 10 at a concentration where agglomeration is a factor. Agglomeration can become an issue even at low concentrations, since small particles often experience electrostatic attraction. However, the present invention utilizes the high surface area nanofibers to reduce particle agglomeration presumable due to the ability of the high surface area nanofiber to accommodate large amounts of nanoparticles.

In one embodiment of the present invention, agglomeration is undesirable since it results in non-uniformity in the dispersion of the luminescent compound in the resultant fibers. Agglomeration can change the color uniformity of the resultant light emissions. In addition, agglomeration also degrades the optical properties of the luminescent compound by causing a red-shifting of the emission frequency and a reduction of emission intensity due to quenching.

The size distribution of the nanoparticles can be controlled by managing a number of parameters such as for example: changing an organic phase of a solvent system, changing a temperature at which the nanoparticles are formed, alternating reactant concentrations used to form the nanoparticles, changing the capping molecule chemistry, adding surfactants to control a coagulation of the material from which the nanoparticles are to be formed, applying an electrical or magnetic field during particle nucleation, applying acoustical energy during the formation of the nanoparticles, etc.

The capping molecule chemistry can include for example forming a shell around the nanoparticle (i.e., the quantum dot) to chemically stabilize the nanoparticle. The surfactants (e.g., organic ligands) can be included around and attached to the outside of the shells to promote solution and prevent agglomeration. Such surfactants help prevent agglomeration of nanoparticles when the nanoparticles are created or used in a dry state. Alternatively, a separation method such as electrophoretic separation can be used after the particle nucleation to achieve a desired particle distribution.

At 500, the electrospinning solution can include additives such as for example organic luminescent materials (dye), ceramics, organo-metallic, carbon, and or metal. For example, the index of refraction of the nanofibers can be increased by adding a material with a high dielectric constant, such as a ceramic like $TiO_2$. The additives are incorporated into a polymer to impart desired physical, chemical, or mechanical properties. The additives are usually mixed with the polymer prior to electrospinning and do not generally form strong chemical bonds with the polymer. Examples of common additives found in polymers suitable for the present invention include pigments (e.g., titanium dioxide), conductive materials (e.g., carbon or metallic flakes), UV stabilizers, and glass reinforcements.

At 510, the conditions in the electrospinning environment are controlled. U.S. Ser. No. 10/819,945 entitled "Electrospinning in a Controlled Gaseous Environment" describes techniques applicable to the present invention for controlling the electrospraying environment. Additionally, refinements of the electrospinning process are described in U.S. application Ser. No. 10/819,916, entitled "Filter Incorporating Nanofibers," previously incorporated herein by reference. The practices described therein can be used in the present invention to produce small diameter nanofibers whose large surface to volume ratio can enhance the brightness of the light emitted from the resultant fiber mat and whose average fiber diameter size is appropriately sized to match the incident light source wavelength.

At 520, techniques in U.S. application Ser. No. 10/819, 916, entitled "Electrospinning of Fibers using a Rotatable Spray Head" to obtain aligned fibers or techniques in U.S. application Ser. No. 10/819,916, entitled "Filter Incorporating Nanofibers" can be used to improve fiber mat density and uniformity.

Light Emitter Incorporation onto Nanofibers During Electrospinning

Figure 7:
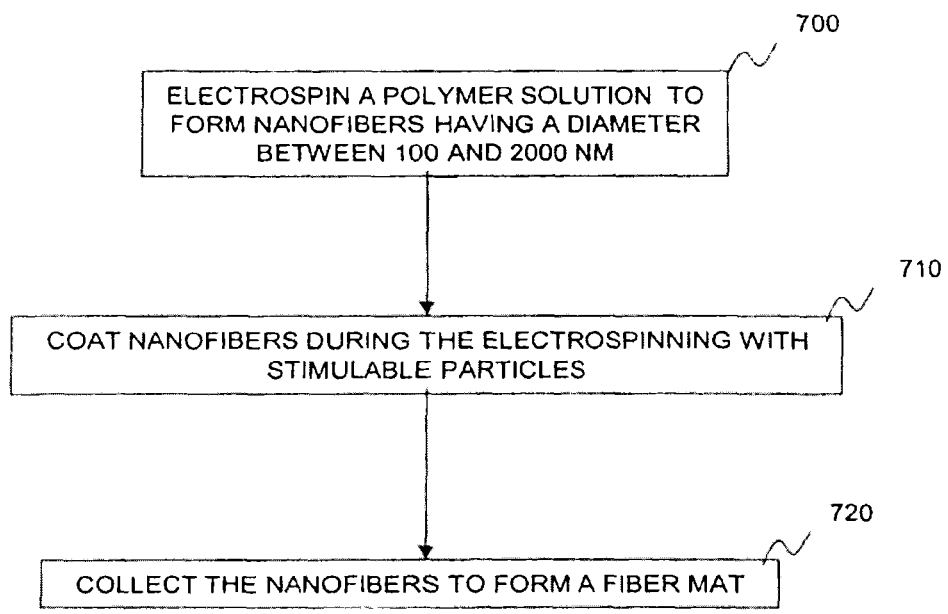
FIG. 7 is a flow chart illustrating a method for forming a luminescent device according to an embodiment of the present invention in which luminescent particles are attached to the electrospun fiber during the electrospinning process.

In one embodiment of the present invention, as discussed above, stimulable particles 4 can be applied to the electrospun fibers 2 as the fibers are coalescing into a resultant fiber mat 6. FIG. 7 is a flow chart illustrating a method for forming a luminescent device according to an embodiment of the present invention in which stimulable particles 4 are attached to the electrospun fiber during the electrospinning process. At 700, a polymer solution is electrospun to form nanofibers having a diameter between 100 and 2000 nm. At 710, the nanofibers are coated during the electrospinning with stimulable particles 4. At 720, the nanofibers are collected to form a fiber mat 6.

In this embodiment, the stimulable particles 4 become positioned at or near the surface of the nanofiber as shown in FIG. 2B. The process at 700 is similar to the process at 500 reflecting the general techniques described above for electrospraying nanofibers in one embodiment under controlled conditions. At 710, stimulable particles 4 are attached onto a surface of the electrospun fibers before the electrospun fibers have dried. At 710, the stimulable particles 4 can be introduced by an electrospray beam directed to a position removed from an electrospraying tip electrospinning the polymer solution. FIG. 4 shows an electrospray unit 48 for introducing the stimulable particles 4 into the electrospinning environment 46.

Low agglomeration of stimulable particles 4 can be achieved by separating the nanofiber formation and light stimulable particle attachment steps. This can be achieved in one embodiment of the present invention by introducing for example stimulable particles 4 (such as from an electrospray solution) into a region where an emerging nanofiber is drying. In an electrospray introduction technique, submicron droplets of the stimulable particle suspensions are generated by electrostatically disrupting a droplet of a solvent (such as for example toluene) containing the quantum dots. The electrosprayed droplets are highly charged (usually positively charged) and do not aggregate due to repulsion of similar charges during their passage to the surface of the polymer nanofiber 6 that, in one embodiment, can be carrying an opposing electrical charge.

Since the nanofiber is drying during ejection from the needle, in one embodiment of the present invention, the location of the electrospray controls the penetration of the stimulable particles 4 into the nanofiber 2. For example, if the electrospray beam is moved closely to the electrospraying tip, the nanofibers will likely be softer since they will contain more solvent and the stimulable particles 4 will embed deeper into the fiber. Alternatively, if the electrospray beam is moved away from the electrospraying tip and closer to the collector, the nanofibers will be drier and the stimulable particles will be restricted to the surface. Other parameters such as the solvent used to disperse the stimulable particles may also influence the penetration depth of the electrosprayed quantum dots.

At 710, the processes described in U.S. Ser. No. 10/819, 945 entitled "Electrospinning in a Controlled Gaseous Environment" for controlling the electrospraying environment to influence (retard) the drying rate of the electrospun fibers are applicable. At 710, the processes described in U.S. Ser. No. 11/130,269 entitled "Nanofiber Mats and Production Methods Thereof" with regard to the delivery and incorporation of particles into fibers are applicable to the present invention.

The process at 720 is similar to the processes described above at 520.

Light Emitter Incorporation onto Nanofibers after Electrospinning

Figure 8:
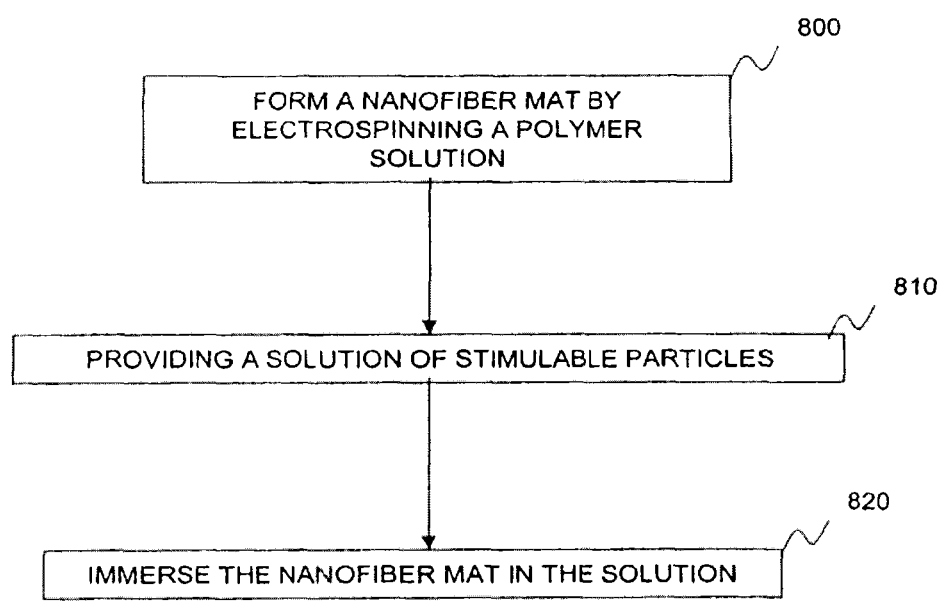
FIG. 8 is a flow chart illustrating a method for forming a luminescent device according to an embodiment of the present invention in which luminescent particles are attached to the electrospun fiber after the electrospinning process.

In one embodiment of the present invention, as discussed above, light stimulable particles such as for example quantum dots can be applied to the fiber mats after electrospinning. This embodiment is illustrated in FIG. 8. According to this embodiment of the present invention, a fiber mat is formed in 800 by electrospinning methods such as for example the techniques described above. At 810, a solution containing the stimulable particles 4 is provided (such as the polymer solution in FIG. 6A). At 820, the nanofiber mat 6 is immersed into the solution. The solution is selected such that the fiber mat does not dissolve but slightly swell the polymers existing in the fiber mat 6.

During the embedment process, the polymer nanofibers may swell due to the solvent. This expansion of the fibers in the network also expands the spaces between the fibers, thus opening the network spaces to allow the particles to move in between. Thus, the particles move to the fiber surface due to the Brownian motion. The fiber mat 6 may be immersed in the solution for a period of 1 minute to 72 hours and may be rinsed with a solvent for 20-60 seconds to ensure the removal of any loosely attached surface particles. The fiber mat 6 may then be placed onto a support and allowed to completely dry under room temperature before use.

Figure 9:
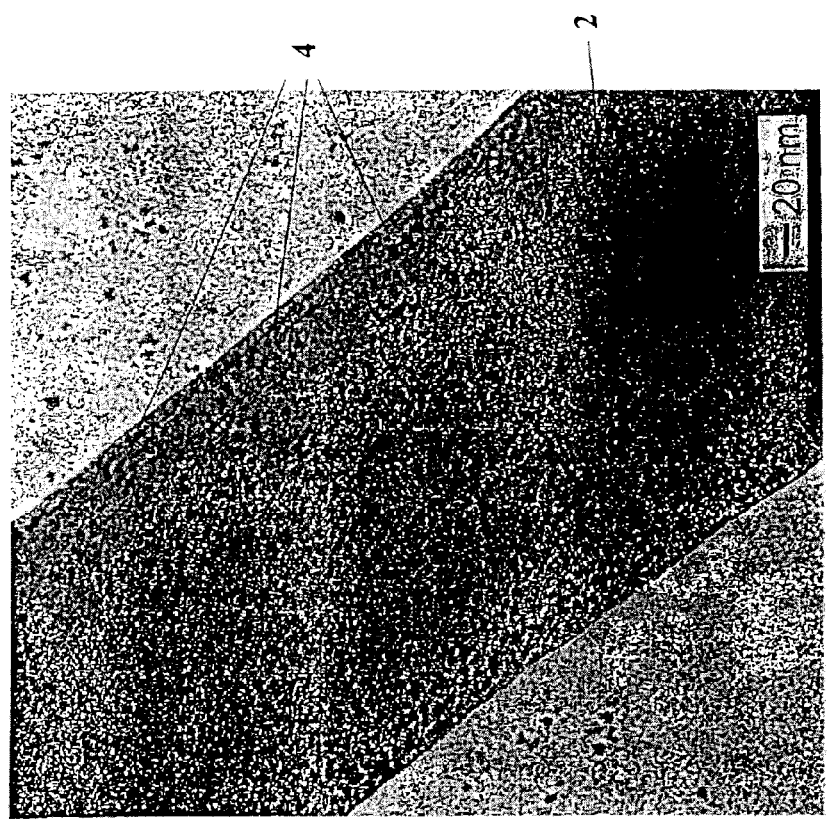
FIG. 9 is a transmission electron microscopy image of a polymer/QD composite nanofiber prepared using the method illustrated in FIG. 8.

FIG. 9 is a transmission electron microscopy image of a polymer/quantum dot composite nanofiber prepared using the method illustrated in FIG. 8. Individual quantum dots 4 are visible at both outside and inside of the fiber 2 in the transmission electron microscopic image of a decorated fiber as shown in FIG. 9. The size of the quantum dots indicates almost no aggregation of the dots.

The surface density of the light stimulable particles on the polymer nanofibers made according to the method of the present invention described in FIG. 8 is controllable by changing variables such as the immersion time of the fibers, nanoparticle solution concentration, the solvent composition, and temperature. The factors such as higher temperature that increase Brownian motion and softens the nanofiber matrix (trace solvents mixed with the non-solvent used in the process) may control both the surface coverage as well as the degree of embedment of the nanoparticles on the fiber. Based on microscopy and the mechanics of the process, the quantum dots (or nanoparticles) embedment may be localized in the periphery of the nanofibers.

While nanoparticle incorporation into a matrix such as a fiber or fiber mat is described in the present invention, this aspect of the present invention is not so limited to electrospinning and fibers. A variety of processes, including the above-noted electrospinning, and other conventional techniques such as spin coating, aerosol handling, electrostatic method, extrusion of filled polymers, self-assembled nanolayers, etc. can be used according to the present invention to form a matrix having a predetermined distribution of luminescent or light stimulable compounds. In those examples, the matrix need not be elctrospun fibers and provides a host upon which exposure to a solvent of the matrix (with the solvent containing a dispersion of the nanoparticles) will result in the embedment of the nanoparticle (i.e., quantum dots, nononphosphors, or electroluminescent particles) into the matrix. The matrix material is preferably organic-based but could include sol-gel materials containing inorganic bases.

Relative Light Emitter Distribution

Figure 12:
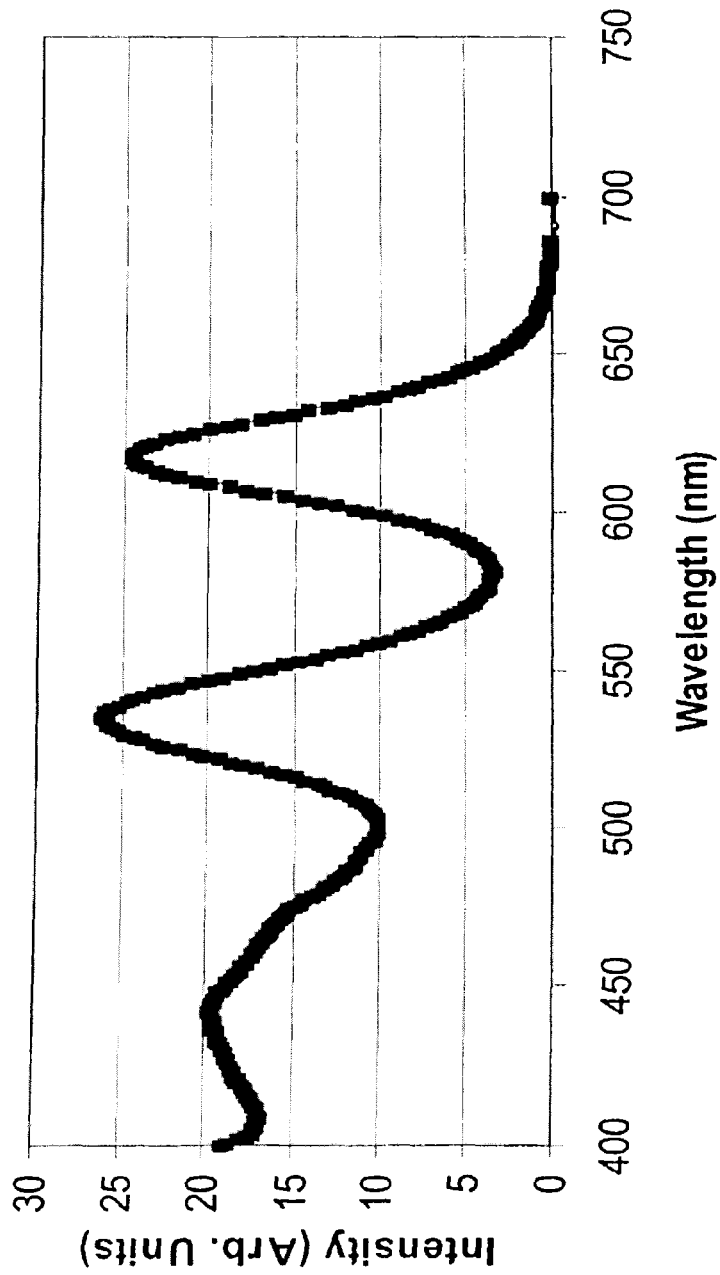
FIG. 12 is a spectrum of the light emitted from a nanofiber containing CdSe/ZnS core-shell quantum dots made in accordance with one embodiment of this invention.

In one embodiment of the present invention, the luminescent compounds used to make the light stimulable devices of the present invention are nanoparticles forming for example either quantum dots or nano-phosphors. Quantum dots (i.e., the stimulable particles 4) emit electromagnetic waves at wavelengths that depend, to a first approximation, on the diameter of the nanoparticles. For example, CdSe nanoparticles of 2.8 nm nominal diameter emit green light at roughly 530 nm, whereas CdSe nanoparticles of 5.0 nm nominal diameter emit red light at roughly 625 nm. An emission spectrum from such a sample is shown in FIG. 12. The mixing of specific nanoparticles (each having a characteristic wavelength emission) can be used in the present invention to produce "white light" similar to the mixing techniques used in the mixing of phosphors for fluorescent lights.

In one embodiment of the present invention, the nominal sizes disclosed for the stimulable particles can have a variance in size distribution or surface structure that results in broadband (as compared to discrete or line emissions). For example, quantum dots of a narrow size distribution that do not contain an inorganic shell layer may exhibit broadband emission due to excitation of surface defects and traps. An example of such materials is found in Bowers et al. Journal of the American Chemical Society vol. 127 (2005) pages 15378-15379 the entire contents of which are incorporated here by reference. Likewise, broad size distributions of core shell quantum dots can be produced by controlling the parameters of the reaction used to synthesize them. The broad band emissions emulate black body radiation sources. Luminescent devices of the present invention exhibiting broad band emissions have a higher color rendering index.

In one embodiment of the present invention, because nanoparticles emit light having a wavelength depending on the diameter of the nanoparticles, white light may be generated from a fiber mat having different diameter nanoparticles dispersed throughout. For example, nanoparticles having a first diameter may produce an electromagnetic wave having a first wavelength, nanoparticles having a second diameter may produce an electromagnetic wave having a second wavelength, and so on until the plurality of nanoparticles produce all the wavelengths necessary to produce a desired spectrum such as that of a blackbody radiator having a CRI approaching 100.

Below are examples of such mixtures determined with regard to various excitation sources:

Example 1

Excitation Source: Blue LED at 450-460 nm

Luminescent compound: a single variety of CdSe/ZnS core shell quantum dots with particle diameter 2.6-3.2 nm (configured for yellow emission and commercially available from Evident Technologies)

Such yellow emitting quantum dots in this example are incorporated into and onto the fibers at weight percentages between 0.1% and 30% (weight quantum dots/weight fiber) with a more suitable range of weight percentage between 1% and 10% depending upon desired light output.

When packaged with the blue LED emitting at 450-460 nm, the blue light from the LED and the yellow emission from the photoluminescent fiber in this example blend to produce white light.

Example 2

Excitation Source: Blue LED at 450-460 nm

Luminescent compound: Two different sizes of CdSe/ZnSe core shell quantum dots with the particle diameter of the first size being 2.4 nm (green emission) and the particle diameter of second size being 5.2 nm (red emission) (purchased from Evident Technologies).

These two sizes of luminescent quantum dots are incorporated into and onto the fibers at weight percentages between 0.1% and 30% (total weight quantum dots/weight fiber) with a more suitable range of weight percentage between 1% and 10%. The ratio of green particles to red particles incorporated into and on the fibers varies between 0.5:1 to 4:1 depending upon desired light output.

When packaged with a blue LED emitting at 450-460 nm, the blue light from the LED and the green and yellow emission from the photoluminescent fiber in this example blend to produce white light.

Example 3

Excitation Source: Violet LED at 408 nm

Luminescent compound: Two different sizes of CdSe/ZnSe core shell quantum dots with the particle diameter of the first size being 2.4 nm (green emission) and the particle diameter of the second size being 5.2 nm (red emission) (purchased from Evident Technologies).

These two sizes of luminescent quantum dots are incorporated into and onto the fibers at weight percentages between 0.1% and 30% (total weight quantum dots/weight fiber) with a more suitable range of weight percentage between 1% and 10%. The ratio of green particles to red particles incorporated into and on the fibers varies between 0.5:1 to 5:1 depending upon desired light output.

When packaged with a violet emitting LED at 408 nm, white light is produced in this example by blending the emission of red and green colors by the photoluminescent nanofiber combined with the violet emission of the LED.

Example 4

Excitation Source: violet LED at 408 nm

Luminescent compound: Three different sizes of CdSe/ZnSe core shell quantum dots with the particle diameter of the first size being 1.9 nm (blue emission), the particle diameter of the second size being 2.4 nm (green emission), and the particle diameter of third size being 5.2 nm (red emission) (purchased from Evident Technologies).

These three sizes of luminescent quantum dots are incorporated into and onto the fibers at weight percentages between 0.1% and 30% (total weight quantum dots/weight fiber) with a more suitable range of weight percentage between 1% and 10%. The ratio of blue particles to green particles to red particles incorporated into and on the fibers varies between 1:1:0.5 to 5:5:4 depending upon desired light output.

When packaged with a violet emitting LED at 408 nm, white light is produced in this example by blending the emission of blue, red, and green colors by the photoluminescent nanofiber. Little to no visible radiation from the LED contributes directly to the white light product.

Example 5

Excitation Source: UV LED at 350-370 nm

Luminescent compound: Three different sizes of CdSe/ZnSe core shell quantum dots with the particle diameter of the first size being 1.9 nm (blue emission), the particle diameter of the second size being 2.4 nm (green emission), and the particle diameter of third size being 5.2 nm (red emission) (purchased from Evident Technologies).

These three sizes of luminescent quantum dots are incorporated into and onto the fibers at weight percentages between 0.1% and 30% (total weight quantum dots/weight fiber) with a more suitable range of weight percentage between 1% and 10%. The ratio of blue particles to green particles to red particles incorporated into and on the fibers varies between 1:1:0.5 to 5:5:1 depending upon desired light output.

When packaged with a UV emitting LED at 350-370 nm, white light is produced by the blending of emissions of the blue, red, and green colors by the photoluminescent nanofiber.

Example 6

Excitation Source: violet LED at 408 nm

Luminescent compound: White-light producing CdSe nanocrystals as described by Bowers et al, in White-light Emission from Magic Sized Cadmium Selenide Nanocrystals, J, American Chemical Society 2005, 127, 15378-15379. These nanocrystals emit broad band radiation that to the eye appears white due to charge recombination from surface states.

These nanocrystals are incorporated into and onto the fibers at weight percentages between 0.1% and 30% (total weight quantum dots/weight fiber) with a more suitable range of weight percentage between 1% and 10%.

When packaged with a violet emitting LED at 408 nm, white light is produced in this example. Little to no visible radiation from the LED contributes to the white light product.

Example 7

Excitation Source: UV LED at 350-370 nm

Luminescent compound: Three different sizes of CdSe/ZnSe core shell quantum dots with the particle diameter of the first size being 1.9 nm (blue emission), the particle diameter of the second size being 2.4 nm (green emission), and the particle diameter of third size being 5.2 nm (red emission) (purchased from Evident Technologies).

The particles are incorporated into the nanofiber in different methods. For example, the red and green quantum dots, which can absorb blue light, can be placed in the interior of the nanofiber by pre-mixing the red and green quantum dots with the polymer solution used for electrospinning (Embodiment I). Then the blue quantum dots can be added to the surface of the nanofiber using either the electrospray (Embodiment II) or liquid-phase coating (Embodiment III) methods described above. The three sizes of luminescent quantum dots are incorporated into and onto the fibers at weight percentages between 0.1% and 30% (total weight quantum dots/weight fiber) with a more suitable range of weight percentage between 1% and 10%. The ratio of blue particles to green particles to red particles incorporated into and on the fibers varies between 1:1:0.5 to 5:5:1 depending upon desired light output.

When packaged with a UV emitting LED at 350-370 nm, white light is produced by the blending of emissions of the blue, red, and green colors by the photoluminescent Luminescent Devices In one embodiment of the present invention, an electrospun fiber mat including luminescent materials is included in an encapsulant such as for example an epoxy matrix.

Figure 10:
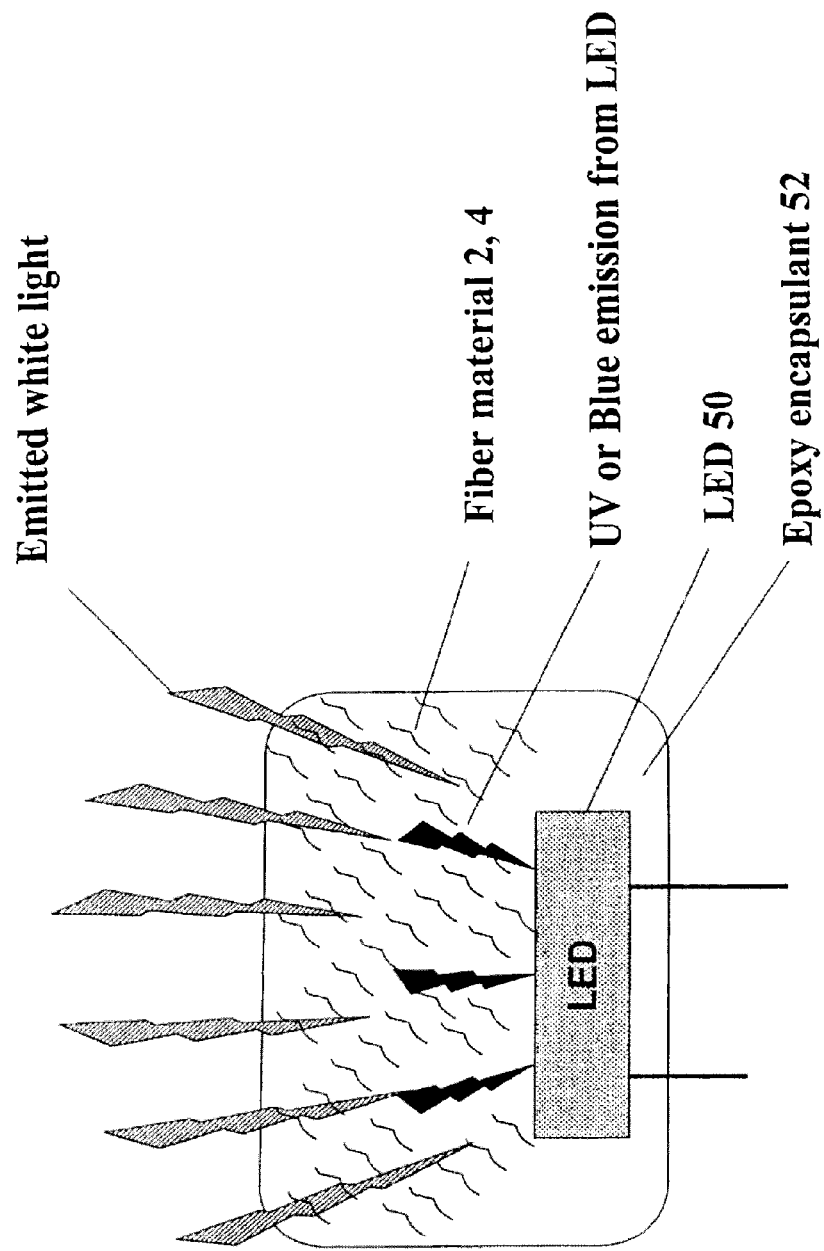
FIG. 10 is a schematic depicting according to one embodiment of the present invention a configuration in which a light emitting diode (LED) couples light through an encapsulant to the fibers including the luminescent materials.
Figure 11:
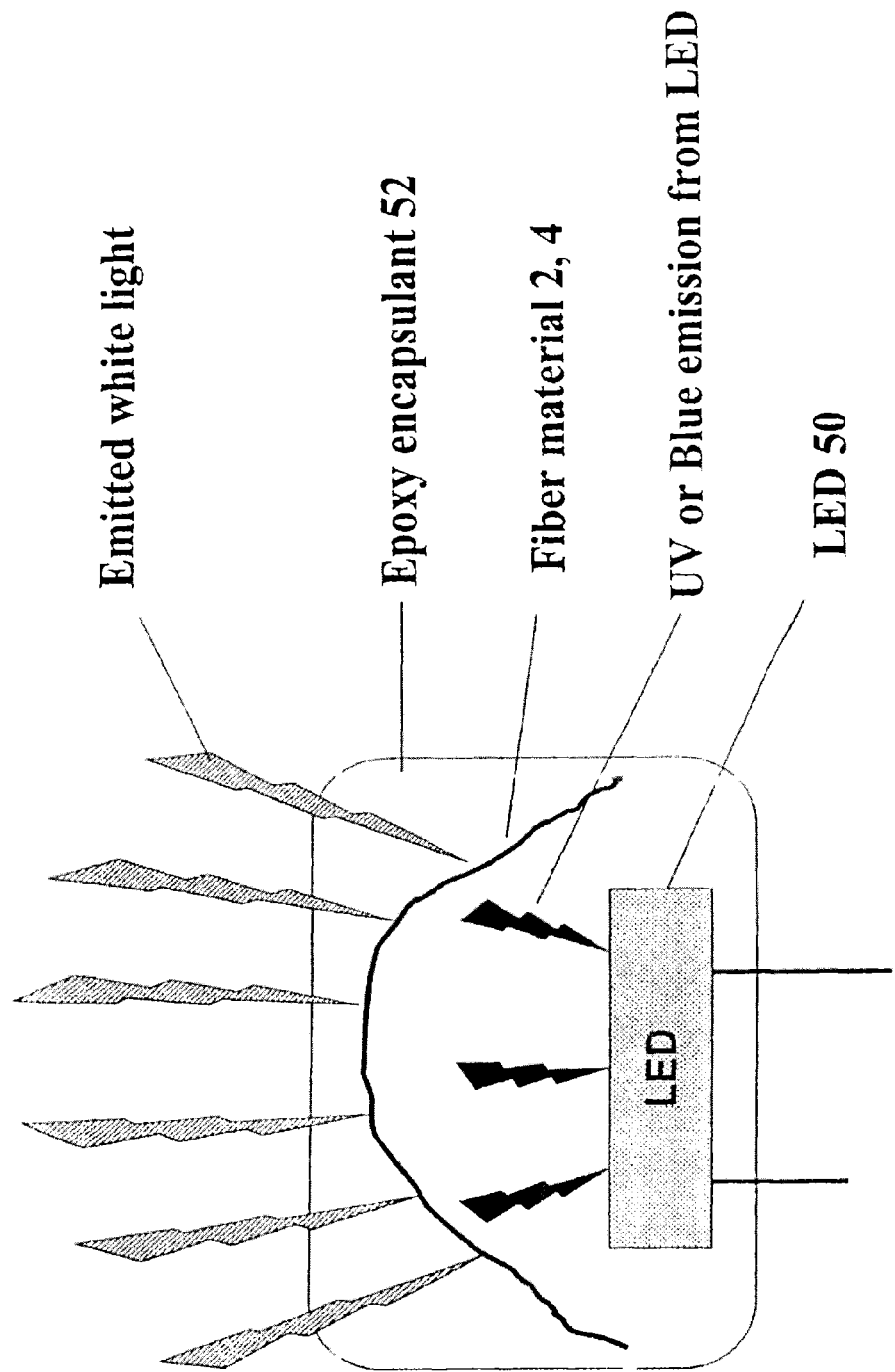
FIG. 11 is a schematic depicting according to one embodiment of the present invention a configuration in which a light emitting diode (LED) couples light through an encapsulant containing therein fibers including the luminescent materials.

FIG. 10 is a schematic depicting according to one embodiment of the present invention a configuration in which a light emitting diode (LED) couples light through an encapsulant to the fibers including the luminescent or light stimulable particles. More specifically, FIG. 11 shows LED 50 emitting UV or blue light through a nanofiber materials 2, 4 having a certain distribution of quantum dots (not shown). The UV or blue light emitted by LED 50 constitutes the incident light for the nanofiber materials 2, 4. The stimulable particles 4 (e.g., the quantum dots) absorb the incident light, and depending on their properties, emit white light. The fiber mat materials 2, 4 are encapsulated, for example, in an epoxy encapsulant 52. The epoxy 52 may encapsulate both the LED 50 and the fiber mat materials 2, 4, either completely or partially. The fiber mat materials 2, 4 may include quantum dots of sizes varying from approximately 1.5 nm to 10 nm to produce a light emission across the desired portion of the visible spectrum. The concentration of various quantum dots (and/or size distribution) is controlled, in one embodiment of the present invention, to provide high quality white light similar to solar emissions.

In other examples, a higher concentration of red emitters than blue emitters may be chosen for other non-white light applications. Thus, the present invention permits both monochromatic and color-distinctive luminescent structures to be made by the respective placement of the appropriate quantum dot light emitter in respective areas of the luminescent structure. Prefabricated fiber mats of respective emission colors (i.e., white, red, blue, green, or a color combination) can be cut and placed in the respective areas, such that a common light source coupled for example through a fiber optic cable would produce different light from the respective areas.

According to another embodiment of the present invention, the mat may be directly placed on the surface of the LED 50 before the encapsulation with epoxy. This placement may reduce energy losses from absorption of UV in the epoxy. Stimulable particles 4 such as the quantum dots may be concentrated near the LED for a maximum absorbing effect. Further as part of the bonding of the nanofiber mat to the LED, interstices in the fibers may be filled with a low refractive index polymer, such as silicone, to optimize the scattering effects required to trap the UV light.

FIG. 10 is a schematic depicting according to one embodiment of the present invention a configuration in which a light emitting diode (LED) 50 couples light through an encapsulant 52 containing therein fibers 2 including the stimulable particles 4. In this embodiment, as shown in FIG. 10, the nanofiber mat including the stimulable particles 4 has been divided (e.g. chopped) and added as filler to the epoxy encapsulant 52, for example an encapsulant typically used in LEDs. An alternative approach is to disperse the fibers by shear of the epoxy. Because the nanofibers may be made small to not interfere with the visible light transparency of the clear epoxy, the optical properties of the epoxy should be unaffected.

Some advantages of the various embodiments of the present invention as compared to the traditional technology include: 1) providing a luminescent material with broad spectral emission can be created by incorporating a distribution of nanoparticles into the light stimulable devices of the present invention; 2) creating such a structure requires less solvent than the casting or electrophoretic methods currently in use for phosphors; 3) allows emission, transmission, and scattering properties of the luminescent material to be controlled separately through a choice of the nanoparticle (i.e., particle density, size, composition, etc.) and nanofiber geometry (i.e., length, diameter, etc.); 4) allows for more efficient operation of the photoluminescent converter due to higher surface area and control of the fiber geometry; and 5) provides a more convenient process to handle and process nanoparticles in finished devices than alternative approaches.

Numerous modifications and variations of the present invention are possible in light of the above teachings. It is therefore to be understood that within the scope of the appended claims, the invention may be practiced otherwise than as specifically described herein.

The invention claimed is:

1. A light scattering device comprising:
   a prefabricated fiber mat configured for disposition in a respective area in a vicinity of a lamp and comprising plural layers of fibers;
   said fibers in the fiber mat having an average fiber diameter between 100 and 2000 nm and individually comprising scattering centers for visible light emitted from the lamp; and
   said fibers layered on each other to form an optical path length in the fiber mat which scatters at least one ray of the visible light incident on the fiber mat multiple times before exiting the fiber mat,
   further comprising an encapsulant disposed in contact with and at least partially encapsulating the fibers of the fiber mat.

2. The device of claim 1, wherein the encapsulant comprises an encapsulant filing interstices in the fibers.

3. The device of claim 1, wherein the encapsulant comprises a substantially transparent encapsulant.

4. The device of claim 1, further comprising stimulable particles disposed in the fiber mat and configured to emit photons upon absorption of the visible light.

5. The device of claim 1, further comprising additives to alter at least one of a refractive index, UV stability, and an electrical conductivity of the nanofibers in the fiber mat.

6. The device of claim 5, wherein the additive is a ceramic.

7. The device of claim 6, wherein the ceramic comprises at least one of zirconium oxide, zinc oxide, zinc sulfide, zinc selenide, zinc silicate, titanium sulfide, titanium oxide, and tin oxide.

8. The device of claim 1, wherein the fibers comprises organic fibers.

9. The device of claim 8, wherein the fibers comprises polymers including at least one of poly(alkyl acrylate), poly(methyl methacrylate), poly(ethylene oxide), polystyrene, polysulfone, polylactides, polycarbonate, polyamides, poly(vinyl alcohol), derivatives thereof, polysilicones, polysulfones, polypropylene, and combinations thereof.

10. The device of claim 1, wherein the fiber mat has a total thickness of less than 3,000 microns.

11. The device of claim 1, wherein the fibers comprises a first group of said fibers and a second group of differently-sized fibers.

12. A light scattering device comprising:
    a prefabricated fiber mat configured for disposition in a respective area in a vicinity of a lamp and comprising plural layers of fibers;
    said fibers in the fiber mat having an average fiber diameter between 100 and 2000 nm and individually comprising scattering centers for visible light emitted from the lamp; and
    said fibers layered on each other to form an optical path length in the fiber mat which scatters at least one ray of the visible light incident on the fiber mat multiple times before exiting the fiber mat, wherein the fibers comprises a first group of said fibers and a second group of differently-sized fibers, and said first group and second group are disposed on respective sides of the fiber mat.

13. The device of claim 12, wherein said average fiber diameter of the first group is between 100 and 600 nm.

14. The device of claim 1, wherein the fiber mat has a thickness in a range between 1 micron and 2,000 microns.

15. The device of claim 1, wherein the fiber mat has a thickness in a range between 50 to 300 microns.

16. The device of claim 1, wherein the fibers in the fiber mat comprise different materials.

17. The device of claim 1, wherein the fibers in the fiber mat comprise substantially transparent fibers.

18. A fiber-based light scattering device comprising:
    a fiber mat including, fibers having an average fiber diameter in a range between 100 and 2000 nm;
    said fibers providing individual scattering centers within the fiber mat for scattering visible light incident on the fiber mat; and
    said fibers layered on each other to form an optical path length in the fiber mat which scatters at least one ray of the visible light multiple times before exiting the fiber mat; and
    an encapsulant disposed in contact with and at least partially encapsulating the fibers of the fiber mat.

19. The device of claim 18, wherein the average fiber diameter is in a range between 100 to 600 nm.

20. The device of claim 18, wherein the average fiber diameter is in a range between 200 nm to 500 nm.

21. The device of claim 18, wherein a wavelength λ of the visible light is in a range between 300 and 600 nanometers.

22. The device of claim 18, wherein the fibers in the fiber mat comprise substantially transparent fibers.

23. The device of claim 18, wherein the fiber mat has a thickness in a range between 1 micron and 2,000 microns.

24. The device of claim 18, wherein the fiber mat has a thickness in a range between 50 to 300 microns.

25. The device of claim 18, wherein the nanofibers include additives to alter at least one of a refractive index, UV stability, and an electrical conductivity of the nanofibers in the fiber mat.

26. The device of claim 25, wherein the additive is a ceramic.

27. The device of claim 18, further comprising an encapsulant disposed in contact with and at least partially encapsulating the fibers of the fiber mat.

28. A fiber-based light scattering device comprising:
    a fiber mat including, fibers having an average fiber diameter in a range between 100 and 2000 nm;
    said fibers providing individual scattering centers within the fiber mat for scattering visible light incident on the fiber mat;

said fibers layered on each other to form an optical path length in the fiber mat which scatters at least one ray of the visible light multiple times before exiting the fiber mat; and an encapsulant disposed in contact with and at least partially encapsulating the fibers of the fiber mat.

* * * * *